United States Patent
Chakraborty et al.

(10) Patent No.: US 11,024,354 B1
(45) Date of Patent: Jun. 1, 2021

(54) LOW POWER LINEAR MEMORY READOUT

(71) Applicant: International Business Machines Corporation, Armonk, NY (US)

(72) Inventors: Sudipto Chakraborty, Plano, TX (US); Rajiv Joshi, Yorktown Heights, NY (US); Steven J. Holmes, Ossining, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/728,041

(22) Filed: Dec. 27, 2019

(51) Int. Cl.
| | |
|---|---|
| *G11C 11/16* | (2006.01) |
| *H03F 3/45* | (2006.01) |
| *H03F 1/56* | (2006.01) |
| *H03H 7/38* | (2006.01) |
| *H04B 1/16* | (2006.01) |

(52) U.S. Cl.
CPC .......... *G11C 11/1673* (2013.01); *H03F 1/565* (2013.01); *H03F 3/45* (2013.01); *H03H 7/38* (2013.01); *H04B 1/16* (2013.01); *H03F 2200/03* (2013.01); *H03F 2200/222* (2013.01); *H03F 2203/45151* (2013.01); *H03F 2203/45526* (2013.01)

(58) Field of Classification Search
CPC ... H03F 1/565; H03F 3/45; H03F 7/38; H03F 2200/03; H03F 2200/222; H03F 2203/45151; H03F 2203/45526; H04B 1/16; G11C 11/1673

USPC ...................................................... 455/248.1
See application file for complete search history.

(56) References Cited

U.S. PATENT DOCUMENTS

| | | | |
|---|---|---|---|
| 6,016,269 A | 1/2000 | Peterson et al. | |
| 6,314,102 B1* | 11/2001 | Czerwiec | H04L 5/0007 370/395.6 |
| 6,842,363 B2 | 1/2005 | Thewes et al. | |
| 8,189,405 B2 | 5/2012 | Murata et al. | |
| 8,514,021 B2* | 8/2013 | Heikkinen | H03F 3/211 330/260 |
| 2010/0060354 A1* | 3/2010 | Maeda | H03F 3/68 330/124 R |

(Continued)

FOREIGN PATENT DOCUMENTS

CN 108182956 A 6/2018

*Primary Examiner* — Nguyen T Vo
(74) *Attorney, Agent, or Firm* — Scully, Scott, Murphy & Presser, P.C.; Daniel P. Morris

(57) ABSTRACT

Circuits and methods are disclosed that, in embodiments, may be used for low power memory signal readout. In an embodiment, the circuit comprises a front end stage including an impedance conversion network for receiving a signal and providing voltage or current gain, and a wideband multiplier for receiving an output signal from the impedance conversion network and converting the output signal to differential output signals; and a baseband stage including a voltage mode mixer for receiving the differential output signals from the wideband multiplier and providing voltage gain, and a bandpass filter/amplifier for receiving a mixer output signal from the voltage mode mixer and filtering and amplifying the mixer output signal; and wherein DC voltages of the front-end stage are biased independently of a biasing of DC voltages of the baseband stage.

20 Claims, 7 Drawing Sheets

(56) References Cited

U.S. PATENT DOCUMENTS

2015/0002324 A1* 1/2015 Sharma ................ H03M 1/126
    341/122

* cited by examiner

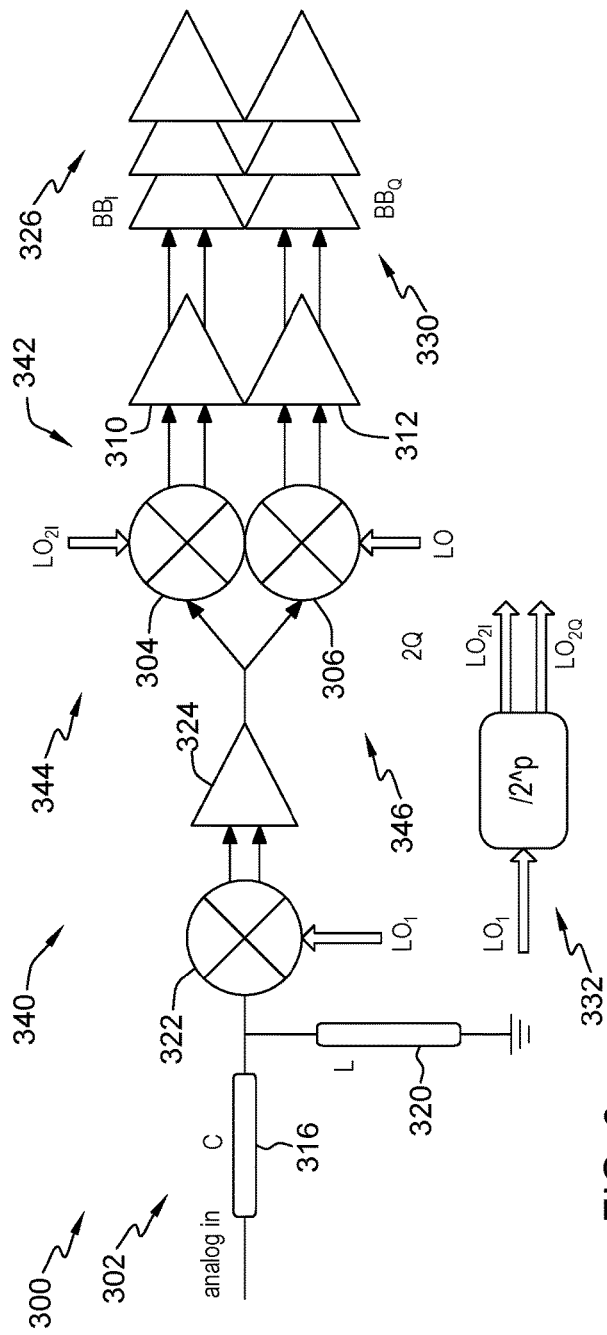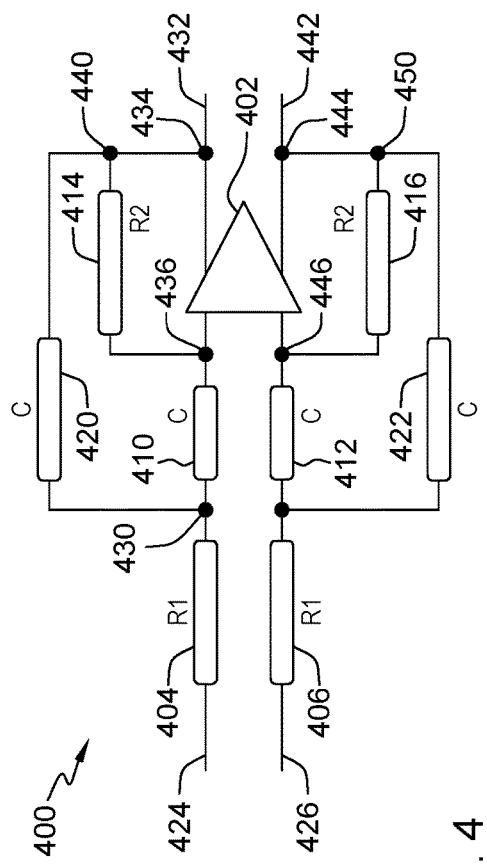
FIG. 3
FIG. 4

LOW POWER LINEAR MEMORY READOUT

BACKGROUND

This invention generally relates to reading electrical signals with low power consumption, and more specifically, to linearly amplifying electrical signals with low power consumption over a wide dynamic range. Embodiments of the invention are used to read low amplitude signals from memory cells.

SUMMARY

According to an embodiment of the invention, a circuit comprises a front end stage including an impedance conversion network for receiving a signal and providing voltage or current gain, and a wideband multiplier for receiving an output signal from the impedance conversion network and converting the output signal to differential output signals; and a baseband stage including a voltage mode mixer for receiving the differential output signals from the wideband multiplier and providing voltage gain, and a bandpass filter/amplifier for receiving a mixer output signal from the voltage mode mixer and filtering and amplifying the mixer output signal; and wherein DC voltages of the front-end stage are biased independently of a biasing of DC voltages of the baseband stage.

According to an embodiment of the invention, a method comprises receiving a signal at a front end stage of a signal readout circuit, including an impedance conversion network of the front end stage providing a voltage or current gain, and a wideband multiplier of the front end stage receiving an output signal from the impedance conversion network and converting the output signal to differential output signals; receiving the differential output signals at a baseband stage of the signal readout circuit, including a voltage mode mixer of the baseband stage providing voltage gain, and a bandpass filter/amplifier of the baseband stage receiving a mixer output signal from the voltage mode mixer and amplifying the mixer output signal; and biasing DC voltages of the front end stage and biasing DC voltages of the baseband stage, and wherein the biasing of the DC voltages of the front end stage is independent of the biasing of the DC voltages of the baseband stage.

Embodiments of the invention use a mixer based architecture followed by linear detector at a baseband filter. In embodiments, linear detector at baseband implies that the output of the detector is proportional to the input signal. Input and output in this context emphasize amplitude. So, the output amplitude is a linear function of the input amplitude.

Embodiments of the invention use passive amplification in the front-end of a low power memory readout, using inductive elements as an autotransformer.

Embodiments of the invention use independent biasing of the mixer and the baseband filter, and provide automatic DC offset cancellation due to the choice of the baseband filter. In embodiments, by construction of the baseband analog processing block (the baseband filter in this case), the capacitors that are used in the filter are in series with the signal propagation, thereby the capacitors block the incoming DC voltage. Hence, the DC offset from the previous blocks are blocked.

Embodiments of the invention achieve a flexible analog detection of the amplitude, phase, or frequency of a signal.

Embodiments of the invention provide a highly linear low power memory readout scheme due to a mixer first architecture.

Embodiments of the invention provide a linear memory readout system that may be used, for example, in MRAM/AI systems. According to an embodiment of the invention, a system comprises a mixer/multiplier front end biased using an inductor element.

In embodiments of the invention, the blocks in the mixer/multiplier front end, and the blocks in the gain and filtering section are independently biased with respect to their DC voltages.

In embodiments, the baseband filters can be cascaded without any DC buildup and amplification from the previous stages.

In embodiments, the capacitive elements used in the gain and filtering section not only provide DC independence, but are part of the filtering function itself.

In embodiments, a matching element in the mixer/multiplier front end can provide voltage or current gain and may use MRAM as an inductor.

In embodiments, the invention can be used to detect the amplitude, phase or frequency of low power signals read out from memory systems.

BRIEF DESCRIPTION OF THE DRAWINGS

FIG. 3 illustrates a low power circuit for linearly reading signals according to an embodiment of the invention.

FIG. 4 shows a baseband filter of the circuit of FIG. 3.

DETAILED DESCRIPTION

Low power linear readout systems with high dynamic range are essential for next generation memory and sensor subsystems. Next generation memory and sensor elements typically operate around a narrow range of frequencies, and are typically similar to radio frequency (RF) type systems. There is a need to detect a small signal (similar to RF signals) and a need to offer a high dynamic range in the detection process.

A traditional readout method uses a sense-amplifier based detection that uses preamplification followed by a latch. This is a highly non-linear process. Also, a sense-amplifier method only works with the amplitude of the signal, and cannot detect frequency. There is a need to construct an ultra low power, linear detector for memory interfaces to detect amplitude, phase, and frequency for the next generation AI hardware solutions.

Figure 1:
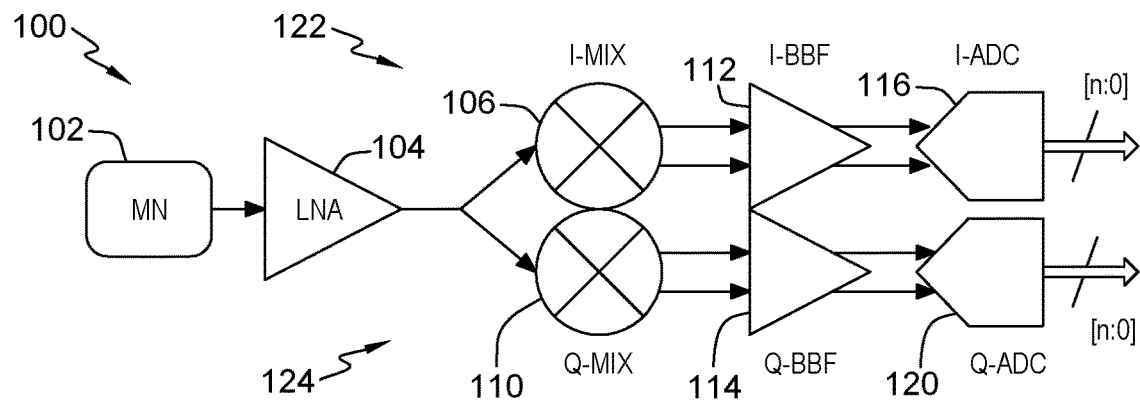
FIG. 1 illustrates a prior art circuit for reading low amplitude signals.

FIG. 1 shows a prior art circuit 100 for reading a low amplitude signal. Generally, circuit 100 comprises matching network 102, low noise amplifier 104, mixers 106, 110, baseband filters 112 and 114, and analog-to-digital converters 116, 120.

In the implementation of circuit 100, matching network 102 receives an input signal and matches the impedance of that signal to the impedance of the rest of circuit 100. From matching network 102, the signal is amplified by low noise amplifier 104 and then provided to mixers 106 and 110.

In the depicted example, circuit 100 includes an in-phase channel 122 and a quadrature channel 124 for respectively processing real and imaginary signal components. For the in-phase channel, an in-phase mixer 106 downconverts the input RF signal to an in-phase baseband signal; and similarly, for the quadrature channel, a quadrature mixer 110 downconverts the input RF signal to a quadrature baseband signal. Both the in-phase and quadratue-phase channels receive the same RF signal at their input terminals.

In general, each of the mixers 106, 110 can include different types of mixer transistors (not shown) that operate with different biasing. For example, each of the mixers may include complementary switches comprising an n-channel metal-oxide semiconductor (NMOS) field-effect mixer transistor, and a p-channel metal-oxide semiconductor (PMOS) field-effect mixer transistor. To bias these different types of mixer transistors, circuit 100 can include a plurality of bias circuits (not shown), such as an NMOS bias circuit and a PMOS bias circuit.

In-phase mixer 106 applies a pair of output signals to in-phase baseband filter 112, and quadrature mixer 110 applies a pair of output signals to quadrature baseband filter 114. Filter 112 accepts the downconverted signals from mixer 106, and filters the signals to produce filtered signals, which are applied to analog-to-digital converter 116. Likewise, filter 114 accepts the downconverted signals from mixer 110, and filters the signals to produce filtered signals that are applied to analog-to-digital converter 120.

Analog-to-digital converter 116 converts the analog signals input from filter 112 to a digital output signal; and similarly, analog-to-digital converter 120 converts the analog input signals from filter 114 to a digital output signal.

Figure 2A:
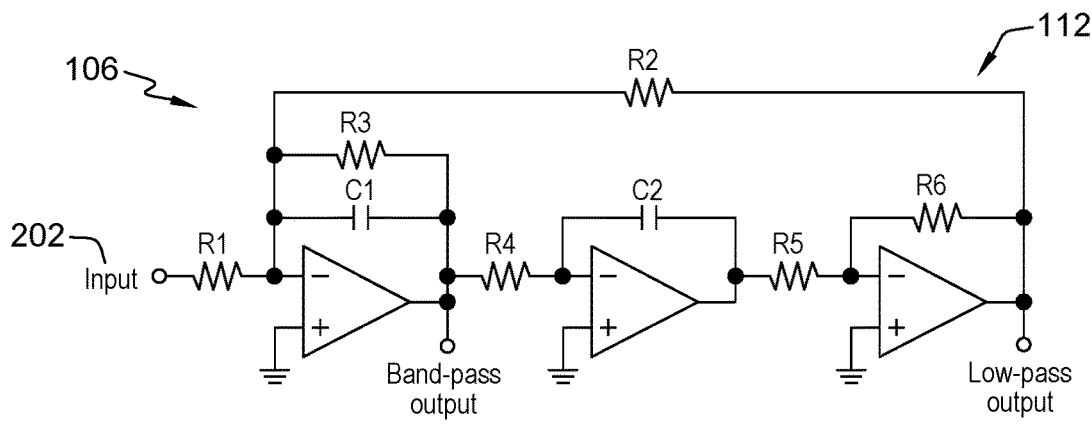
FIG. 2(a) shows in more detail a mixer and a baseband filter of the circuit of FIG. 1.

With the system of FIG. 1, the mixers 106, 110 are biased through the matching network 102, and the interfaces between the mixers and the baseband filters provide signal gain and blocker immunity. Current mode interface means that the baseband filter provides a low impedance at the input, while voltage mode interface means that the baseband filter provides a high impedance at the input. In traditional wireless communications, current mode interface is preferred, as the low impedance is used to implement less voltage swing in the event of a large blocker accompanying a small input signal. This is employed by using an OPAMP in feedback. One common construction is shown in FIG. 2(a). A fully differential construction, an example of which is shown in FIG. 2(b), is typically used.

In the construction of FIG. 2(a), the input 202 is directly coupled to the mixer (or any previous blocks driving the baseband filter). The input voltage creates current that is given by V/R1, and is provided to the virtual ground of the baseband filter (virtual ground is created by connecting a feedback resistor between the outputs and the inputs of the OPAMP using negative feedback).

Figure 2B:
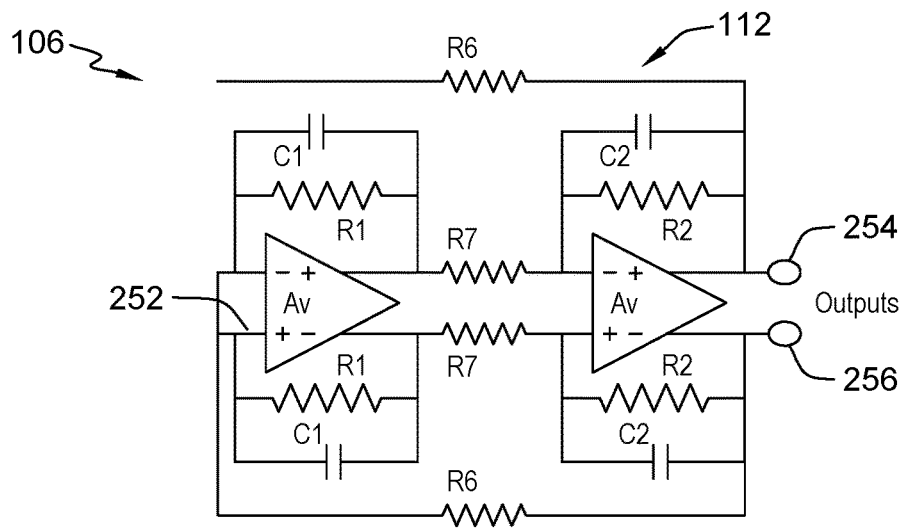
FIG. 2(b) shows a baseband filter that may be used in the circuit of FIG. 1, and including a fully differential construction.

FIG. 2(b) shows a baseband filter that may be used in the circuit 100 of FIG. 1, and including a fully differential construction. In a fully differential design, an inverting stage is not necessary, as inversion is typically achieved by flipping wires. In the construction of FIG. 2(b), the input 252 is obtained from the mixer, and the baseband filer provides outputs at 254 and 256.

In the circuit of FIG. 1, DC offset cancellation is needed at the input of the baseband filter to prevent saturation of the last stage, and the circuit consumes substantial amount of power. In differential signal processing, an input signal X is processed as two separate signal X/2 and −X/2, and provided to a differential amplifier. However, this amplifier is not perfect; it also has some intrinsic offset voltage, voff. So, the signals processed by the amplifier become (X/2+voff) and −X/2. These are amplified by the amplifier gain A, to obtain A*voff at the output, which is the "output DC offset" in response to the "input DC offset". The DC offset needs to be cancelled/corrected before it is applied to the next stages. For example, three stages of amplification with each amplifier providing a gain of 10, will lead to a cascaded gain of 1000, and will amplify a DC offset of 1 mV to 1V, leaving very minimum room for the signal to be processed. Typically, a current steering digital to analog converter (DAC) provides current to the input nodes of the baseband filter (the virtual ground terminals), to cancel this offset. The DC offset DAC, along with a resistor at the input will provide a voltage −voff, and will cancel the original offset For high dynamic range readout application, DC offset cancelation must be performed. In the event the circuit solutions consume very low power (such as nanoampere levels), implementation of DC offset compensation DAC become prohibitive in terms of power, area, and current accuracy.

FIG. 3 illustrates a circuit 300 for reading low amplitude signals according to an embodiment of the invention. The embodiment of circuit 300 shown in FIG. 3 comprises matching network 302, mixers 304, 306, and baseband filters 310, 312. In this embodiment, matching network 302 includes capacitor 316 and inductor 320, and the circuit 300 further comprises mixer 322, a stage one amplifier 324, a first cascade 326 of amplifiers, and a second cascade 330 of amplifiers.

A local oscillator signal LO1 is used to bias mixer 322. As represented at 332, this local oscillator signal is divided into a plurality of signals LO2I, LO2Q, and signal LO2I is used to bias mixer and signal LO@Q is used to bias mixer 312.

In embodiments of the invention, separate biases are used for the front-end 340 and the back-end 342 of circuit 300. In embodiments of the invention, the mixer 322 can use a different bias compared to that of the baseband filters 310, 312. The DC blocking capacitors that are part of the filters 310, 312 provide this independence. In this specific design illustration, the mixer transistor (NMOS type in the Fig., may also be PMOS type in actual implementation) uses a 0V DC bias through the matching network 302. 0V implies a connection to ground and no additional bias network is needed. The baseband filters 310, 312 can use a voltage at half of the supply, $V_{DD}/2$ to maximize signal swing at the baseband output. In the prior art, a direct connection using current mode interface, leads to using complementary choice of transistors. Mixer using NMOS transistors are directly coupled to the OPAMPs using PMOS transistors at the input, or PMOS transistors are directly coupled to the OPAMPs using NMOS transistors at the input. In embodiments of the invention, this is not necessary. The interface is voltage mode (the baseband filter provides a moderate impedance), the mixer can be independently biased compared to the OPAMP, and each can be maximized for its specific dynamic ranges.

In the implementation of circuit 300, matching network 302 receives an input signal and matches the impedance of that signal to the impedance of the rest of circuit 300. From matching network 302, the signal is passed to mixer 322, which downconverts the input signal; and from mixer 322, the signal is amplified by stage one amplifier 324 and then passed to mixers 304, 306.

In the depicted embodiment, circuit 300 includes an in-phase channel 344 and a quadrature channel 346 for respectively processing real and imaginary signal components. For the in-phase channel 344, an in-phase mixer 304 downconverts an in-phase baseband signal; and, similarly, for the quadrature channel 346, a quadrature mixer 306 downconverts a quadrature baseband signal.

As mentioned above, local oscillator signal LO1 is divided into a plurality of signals LO2I and LO2Q that are used to bias mixer 304 and mixer 306 respectively.

In-phase mixer 304 applies a pair of output signals to in-phase baseband filter 310, and quadrature mixer 306 applies a pair of output signals to quadrature baseband filter 312. Filter 310 accepts the downconverted signals from mixer 304 and filters the signals to produce filtered signals, which are applied to a cascade 326 of baseband amplifiers. Similarly, filter 312 accepts the downconverted signals from mixer 306 and filters the signals to produce filtered signals, and these filtered signals are applied to a cascade 330 of baseband amplifiers.

Each of the baseband filters 310, 312 may act as a low-pass, band-pass, or high-pass filter. Each of the baseband filters can be implemented by a variety of different types of filters, including surface acoustic wave (SAW) filters, bulk acoustic wave (BAW) filters, mechanical filters, crystal filters, ceramic filters, lumped-element filters, and so forth.

The outputs of the amplifier cascades 326, 330 can be used or processed in any suitable way. For instance, the outputs may be applied to analog-to-digital converter which converts the output signals to digital signals.

FIG. 4 shows in more detail a baseband filter 400 that may be used as filter 310 or filter 312 of FIG. 3. Generally, filter 400 comprises OPAMP 402, a pair of input resistors 404, 406, a pair of input capacitors 410, 412, parallel resistors 414, 416 and parallel capacitors 420, 422. Resistor 404 and capacitor 410 are located in input line 424 and in series with a first input of amplifier 402, and resistor 406 and capacitor 412 are located in input line 426 and in series with a second input of the amplifier. Capacitor 420 is positioned in parallel with amplifier 402 and is connected to input line 424 at node 430, between resistor 404 and capacitor 410, and to output line 432 at node 434. Resistor 414 is located in parallel with amplifier 402 and is connected to input line 424 at node 436, between capacitor 410 and amplifier 402, and to output line 432 via node 440. Capacitor 422 is also positioned in parallel with amplifier 402 and is connected to input line 426 at node 442, between resistor 406 and capacitor 412, and to output line 442 at node 444. Resistor 416 is located in parallel with amplifier 402 and is connected to node 446, between capacitor 412 and amplifier 402, and to output line 442 via node 450.

In embodiments of the invention, separate biases are used for the front-end and the back-end of the circuit 300. Also, in embodiments of the invention, matching network 302 comprises a capacitive impedance transformation, or an autotransformer based transformation. In embodiments of the invention, baseband amplification stages can be capacitively coupled to prevent DC buildup.

Figure 5:
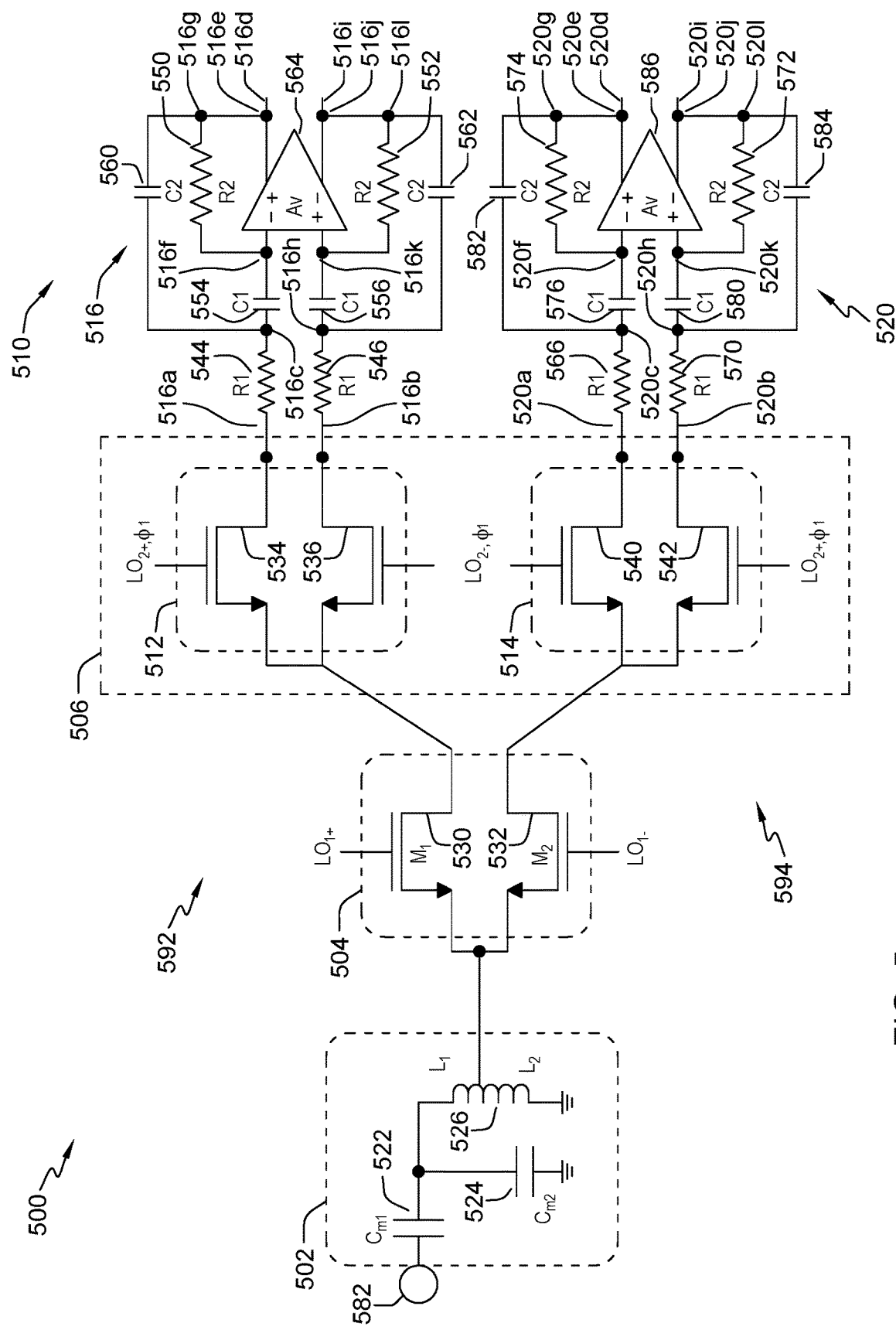
FIG. 5 shows a low power circuit for linearly reading signals using more than one stage of multiplication, according to another embodiment of the invention.

FIG. 5 shows in more detail a circuit 500 for reading low amplitude signals according to an embodiment of the invention. Generally, the embodiment of circuit 500 shown in FIG. 5 comprises matching network 502, wideband multiplier 504, voltage mode mixers 506, and bandpass filter/amplifiers 510. In this embodiment, circuit 500 includes two voltage mode mixers 512 and 514 and two filter/amplifiers 516 and 520. In this embodiment of circuit 500, matching network 502 includes capacitors $C_{M1}$ 522 and $C_{M2}$ 542 and an inductor 526 having $L_1$ and $L_2$ portions. Also, wideband multiplier 504 includes transistor switches 530, 532, voltage mode mixer 512 includes transistor switches 534, 536, and voltage mode mixer 514 includes transistor switches 540, 542. In this embodiment of circuit 500, bandpass filter/amplifier 516 includes resistors R1 544, 546 and R2 550, 552, capacitors C1 554, 556 and C2 560, 562 and amplifier 564; and bandpass filter/amplifier 520 includes resistors R1 566, 570 and R2 572, 574, capacitors C1 576, 580 and C2 582, 584, and amplifier 586.

Local oscillator signals $LO_1$ are used to dynamically switch transistors 530, 532, and local oscillator signals $LO_2$ are used to dynamically switch transistors 534, 536, 540, 542 of the voltage mode mixers 512, 514.

In the implementation of circuit 500, matching network 502 receives, at 590, an input signal from an external device (not shown) and matches the impedance of that signal to the impedance of the rest of circuit 500. From matching network 502, the signal is passed to wideband multiplier 504 which downconverts the applied signal and splits the applied signals into two components that are passed to voltage mode mixer 512 and voltage mode mixer 514 respectively.

In the example depicted in FIG. 5, circuit 500 includes an in-phase channel 592 for processing real signal components, and a quadrature channel 594 for processing imaginary signal components. For the in-phase channel, in-phase mixer 512 downconverts an in-phase signal from mixer 504; and likewise, for the quadrature channel, quadrature mixer 514 downconverts a quadrature baseband signal.

Local oscillator signals $LO_1$ are used to dynamically switch transistors 530, 532 of wideband multiplier 504, and local oscillator signals $LO_2$ are used to dynamically switch transistors 534, 536, 540, 542 of voltage mode mixers 512, 514.

In phase mixer 512 applies a pair of output signals to in-phase baseband filter 516, and quadrature mixer 514 applies a pair of output signals to quadrature baseband filter 520. Filter 516 accepts the downconverted signals from mixer 512 and filters the signals to produce filtered signals. Similarly, filter 520 accepts the downconverted signals from mixer 514 and filters the signals to produce filtered signals.

More specifically, in filter 516, resistor 544 and capacitor 554 are located in input line 516a and in series with a first input of amplifier 564, and resistor 546 and capacitor 556 are located in input line 516b and in series with a second input of the amplifier 564. Capacitor 560 is positioned in parallel with amplifier 564 and is connected to input line 516a at node 516c, between resistor 544 and capacitor 554, and to output line 516d at node 516e. Resistor 550 is located in parallel with amplifier 564 and is connected to input line 516a at node 516f, between capacitor 554 and amplifier 564, and to output line 516d via node 516g. Capacitor 562 is also positioned in parallel with amplifier 564 and is connected to input line 516b at node 516h, between resistor 546 and capacitor 556, and to output line 516i at node 516j. Resistor 552 is located in parallel with amplifier 564 and is connected to node 516k, between capacitor 556 and amplifier 564, and to output line 516i via node 516l.

In filter 520, resistor 566 and capacitor 576 are located in input line 520a and in series with a first input of amplifier 586, and resistor 570 and capacitor 580 are located in input line 520b and in series with a second input of the amplifier 586. Capacitor 582 is positioned in parallel with amplifier 586 and is connected to input line 520a at node 520c, between resistor 566 and capacitor 576, and to output line 520d at node 520e. Resistor 574 is located in parallel with amplifier 586 and is connected to input line 520a at node 520f, between capacitor 576 and amplifier 586, and to output line 520d via node 520g. Capacitor 584 is also positioned in parallel with amplifier 586 and is connected to input line 520b at node 520h, between resistor 570 and capacitor 580, and to output line 520i at node 520j. Resistor 572 is located in parallel with amplifier 586 and is connected to node 520k, between capacitor 580 and amplifier 586, and to output line 520i at node 520l.

In embodiments of the invention, the matching network 502 provides voltages or current gain and improves the sensitivity of the circuit. The matching network provides capacitive coupling to the external device whose output signal is applied to the matching network. In embodiments, that device may be a device under test (DUT). Hence, the DC level of the memory/sensor elements is completely suppressed using the front-end matching network construction itself.

In embodiments of the invention, the tapped inductor 526 of the matching network 502 provides DC bias and impedance transformation. In embodiments, the matching network provides a single pin interface to an external device. This may be important for next generation computing.

In embodiments of the invention, components of the matching network 502 can be realized on chip, or fully integrated with the rest of circuit 500, and components of the matching network can be programmable. In the embodiment of matching network shown in FIG. 5, $C_{mi}$ blocks any DC perturbation at the external device whose output signal is applied to the matching network.

In embodiments of the invention, wideband multiplier 504 converts single-ended inputs into differential outputs, and the multiplier can use DC voltage if the received signal is at a low frequency. In embodiments, multiplier 504 can have both I and Q paths, and can use low distortion transistor switches. In embodiments, wideband multiplier 504 can work with lower loading to the clock generator for the local oscillator, and can work with input sinusoidal waveshapes. In embodiments of the invention, multiplier 504 does not need a DC bias current and does not produce any flicker or signal noise, and thermal noise is limited by the dynamic on resistance ($r_{ON}$) of the transistors 530, 532.

In embodiments, the voltage mode mixer 506 provides voltage gain, and the bias of the filter/amplifier 510 is in the mid-rail range. In embodiments of the invention, the voltage mode mixer 506 provides an optimum or maximum signal swing at the output, and no DC offset compensation is necessary. In embodiments, RF gain steps are implemented by segmenting multiple transistors (not shown) in the voltage mode mixer 506. In embodiments, RF gain steps are possible by tapping at different points of the transformer 526; and in embodiments, RF gain steps are possible by adjusting the bulk voltage of $M_1$ and $M_2$. In embodiments of the invention, RF gain steps are possible by adjusting the duty cycle of the LO waveforms coupled to $M_1$ and $M_2$.

In embodiments of the invention, the bandpass filter/amplifier 510 provides one active stage per biquad function. In embodiments, C1 and C2 block DC from the previous stage, and this eliminates the expensive DC offset cancellation network (saves both power and area). In embodiments, the wideband multiplier 506 and the baseband filter 510 can be biased independently. Also, in embodiments, the input intercept point 2 (IIP2) terms can be easily filtered out. As IIP2 is primarily a function of transistor mismatch and the quadrature accuracy of the LO signals, a smaller size transistor may be used to reduce area and power consumption.

In embodiments of the invention, the DC offset at the output of the bandpass filter 512 is only from one stage of the circuit 500. In embodiments, subthreshold biasing of the transistors in the bandpass filter is possible, and smaller device sizes in the baseband may be used, compared to the device sizes when they are biased in strong inversion. In embodiments of the invention, there is no DC current through the R2 resistors, and the resistors R2 and capacitors C2 of the bandpass filter can be interchanged without changing the transfer function of the bandpass filter. Also, in embodiments of the invention, an operational transconductance amplifier (OTA) can be implemented in the bandpass filter using a single transistor with common mode feedback (CMFB).

In embodiments of the invention, the wideband multiplier 504 can use different LO frequencies, and multiple phases can be used for automatic gain control (AGC) function (using precise duty cycle). In embodiments of the invention, a plurality of wideband multipliers can be used in parallel, and the frequencies of the signals $LO_2$ applied to multipliers 512, 514 can be substantially lower than the frequency of the signal $LO_1$ applied to multiplier. Also, in embodiments of the invention, double balanced multipliers can be used as mixers, and these mixers can have an array of transistor switches with N phases.

Embodiments of the invention use a mixer biased for minimum ON resistance, and a baseband filter biased for maximum gm/I.

The ON resistance of a transistor is given by $r_{ON}=1/[\beta*(V_{GS}-V_T)]$, where $\beta$ is the device transconductance, and given by $\beta=\mu*COX$, where $\mu$ is the majority carrier mobility in the device, COX is the oxide capacitance. So, in this specific embodiment of the invention, the sources of the transistors 530, 532 are biased to 0V through the impedance conversion network 502 (also known as matching network). When the transistor is turned ON, by providing $V_G=V_{DD}$, then $V_{GS}=V_{DD}-0=V_{DD}$, the highest voltage that can be provided to the transistor. An NMOS transistor provides high mobility, and by providing the bias directly from the matching network 502, leads to maximizing $V_{GS}$, and minimizing $r_{ON}$. In the prior art (when an NMOS mixer is biased using the common mode provided by the baseband filter), this voltage cannot be 0V (due to the structures used in the prior art, this voltage cannot be 0V), and the $r_{ON}$ cannot be minimized.

MOS transistors are typically used as transconductors. For a given input voltage, they provide an output current. The ratio of the output current to the input voltage is given by the transconductance, $g_m$, which is a function of the quiescent current through the device. When the transistor is biased in saturation region, $g_m=sqrt(2*\mu n*C_{OX}*I*W/L)$, and when the device is biased in subthreshold, $g_m$ is given by $g_m=I/V_t$, where I is the quiescent current (bias current), and Vt is the thermal voltage, given by $V_t=kT/q$ (T is absolute temperature, and q is the charge of an electron).

In embodiments of the invention, a low frequency analog filter 510 (gain and filtering section) is biased by itself (self biased).

In embodiments of the invention, due to the construction, the resistance R2, which is coupled between the output and input of the analog filter does not consume any DC current, as no DC current flows to the gate of MOS transistors.

Thereby, the output DC voltage equals the input DC voltage, so the output of the OPAMP used in the filter, biases the input. In this way, the baseband filter is self biased. In embodiments of the invention, no DC offset compensation network is used. This saves significant area, and calibration overhead. In an aspect, an embodiment of the invention does not require any special biasing techniques in the analog/baseband section 510, and the DC blocking capacitors are part of the filter's transfer function itself.

Figure 6A:
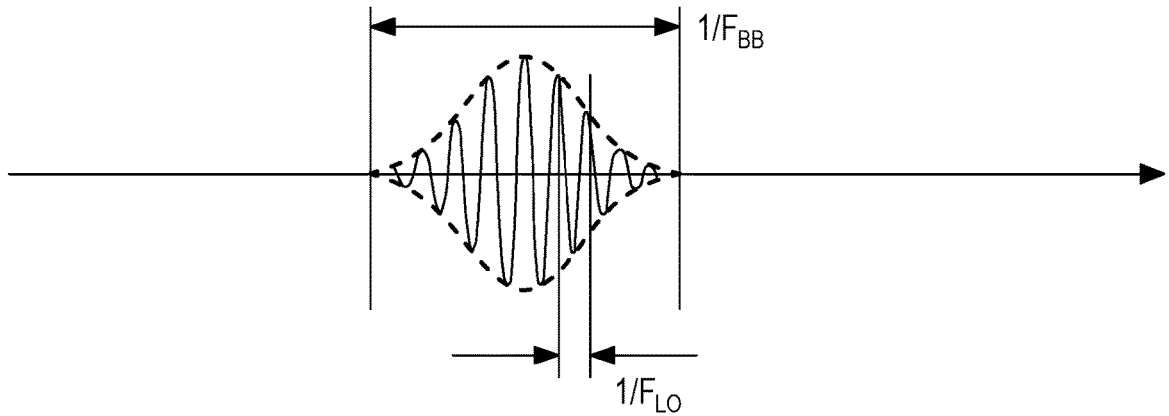
FIGS. 6A and 6B illustrate frequency shifting in the signal in the process of multiplication, along with the baseband envelope being processed in the circuit of FIG. 5.
Figure 6B:
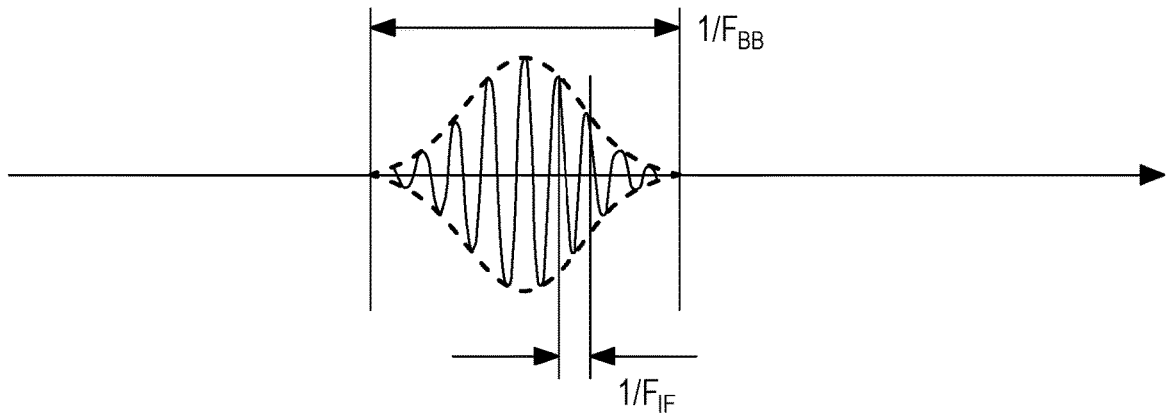

FIGS. 6A and 6B illustrate the time domain waveforms as the signal passes left to right through the circuit 500 of FIG. 5. The first stage, receiving the signal is the matching network 502, which does not perform any frequency conversion. The matching network provides a scaling of the input signal amplitude. The mixer 504 provides the down-conversion. If the input of the receiver is $x(t)=A_{rf}*\cos(\omega_{rf}*t+\varphi)$, {wherein Arf is the input amplitude, and $\omega_{rf}$ is the angular frequency of the RF signal}, then the input to the mixer is $x2(t)=k1*Arf*\cos(\omega_{rf}*t+\varphi)$, where k is the conversion gain (loss) of the matching network. The mixer 504 works as the multiplier with respect to its local clock (LO, at angular frequency of $\omega_{LO}$), and the output becomes $x3(t)=k1*k2*Arf*\cos\{(\omega_{rf}-\omega_{lo})t+\varphi\}$, where k2 is the gain, and $\omega_{IF}=\omega_{rf}-\omega_{LO}$.

FIG. 6A shows the RF input waveform, and FIG. 6B shows the baseband waveform. The time period of the carrier inside the envelope of the first waveform is given by $1/F_{LO}$, where $F_{LO}=\omega_{LO}/(2*\Pi)$. Similarly, the time period of the IF waveform is given by $1/F_{BB}$, where $F_{BB}=\omega_{BB}/(2*\Pi)$.

Figure 7:
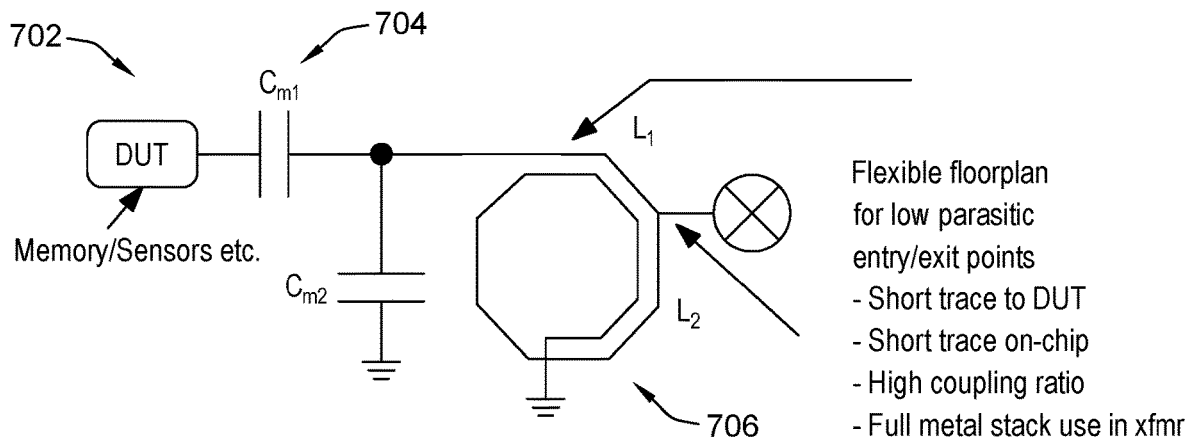
FIG. 7 shows details of a matching network construction in an embodiment of the invention.

FIG. 7 shows details of the matching network 702 construction along with the capacitor 704 and tapped inductor 706, in an embodiment of the invention. In an embodiment, the inductor 706 is fabricated using a back-end-of-line metal stack in a standard semiconductor technology. In this case, CMOS technology and copper metals are used. As an example, there are five layers of metal, and a magnetically coupled transformer should be used for implementing the inductive element. As it is magnetically coupled, the two coils (primary and secondary), can be implemented using a sandwich of two metal layers and three metal layers respectively. For example, the primary coil is M1 and M2, the secondary coil is M3, 4, 5 (as an example). In another example, the upper metal layers and M4 can work as the primary coil, while M5 can work as the secondary coil with no DC connection between them. Hence, for a magnetically coupled transformer, neither the primary terminal, nor the secondary terminal can use the entire stack of metals (e.g. M1/2/3/4/5). In embodiments of the invention, using all metal layers is the best choice to achieve highest quality factor and low loss.

The auto-transformer provides advantages. In an auto-transformer, a mid point of the entire structure is connected to, while the entire coil uses all the metallization stack that could be possible to use. In contrast to the magnetically coupled transformer, this type of electrically coupled transformer can maximize the quality factor, and consume smaller lateral area, thereby leading to low power and low area for the front-end of the circuit. Electrically coupled transformers also provide a high coupling factor compared to the magnetically coupled transformers. The design of FIG. 7 demonstrates one way where the connection from the auto transformer to the circuit is minimized using a very small trace to minimize degradation of the quality factor. This is performed by tapping to the point that is closest to the on-chip circuit.

$$A_v = \frac{V_o(s)}{V_i(s)} = \frac{-\left(\frac{R_2}{R_1}\right)\sqrt{\frac{1}{R_1 R_2}}s}{s^2 + 2\sqrt{\frac{R_1}{R_s}}s + 1}$$

Max Gain $\quad A_{max} = -\left(\frac{R_2}{2R_1}\right)$

Filter Q $\quad Q = \frac{1}{2}\sqrt{\frac{R_2}{R_1}}$

Center frequency $\quad f_c = \frac{1}{2\pi C}\sqrt{\frac{1}{R_1 R_2}}$

Provides the transfer function of the baseband filter shown in FIG. 5. S=jw, where w is the angular frequency, $=2*\Pi*f$, where f is frequency in Hz. So, a plot of Av vs. f provides the frequency response of the baseband filter. Av,max is the maximum voltage gain, Q is the quality factor of the filter as defined in Q=Fc/F3 dB, where Fc is the center frequency of the bandpass stage, and F3 dB is the 3 dB bandwidth, given by F2−F1, where F2 and F1 are frequencies where the amplitude Av,3 dB=Av,max-3 dB. Fc is the center frequency. It should be noted that the center frequency (Fc) and the quality factor (Q) are interdependent on each other.

FIGS. 8A-8F sow simulation results of an embodiment of the invention. In this simulation, the RF frequency is equal to 6.5 GHz, and the IF frequency is equal to 6.5 MHz.

Figure 8A:
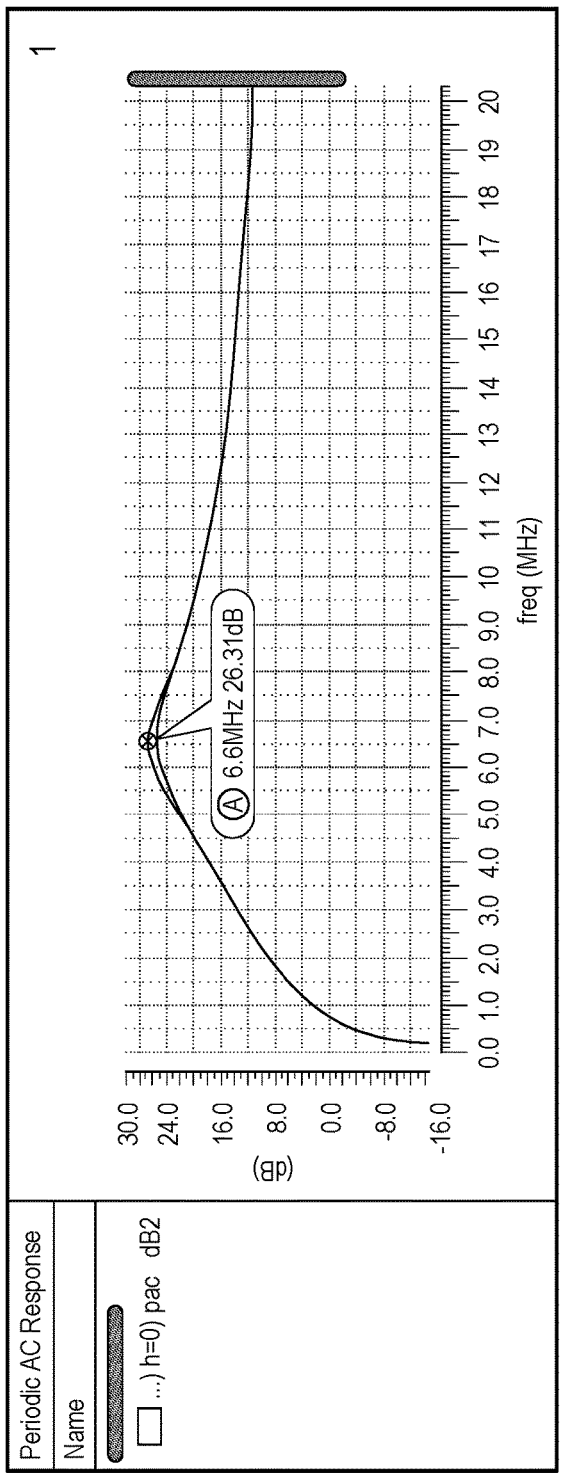
FIGS. 8A-8F shows results of a simulation of an embodiment of the invention.

FIG. 8A: Simulation result from the input of the matching network 502 to the output of the baseband filter 510. The transfer function is of the entire front-end including all the blocks. This Fig. shows a bandpass characteristics with maximum gain=24 dB.

Figure 8B:
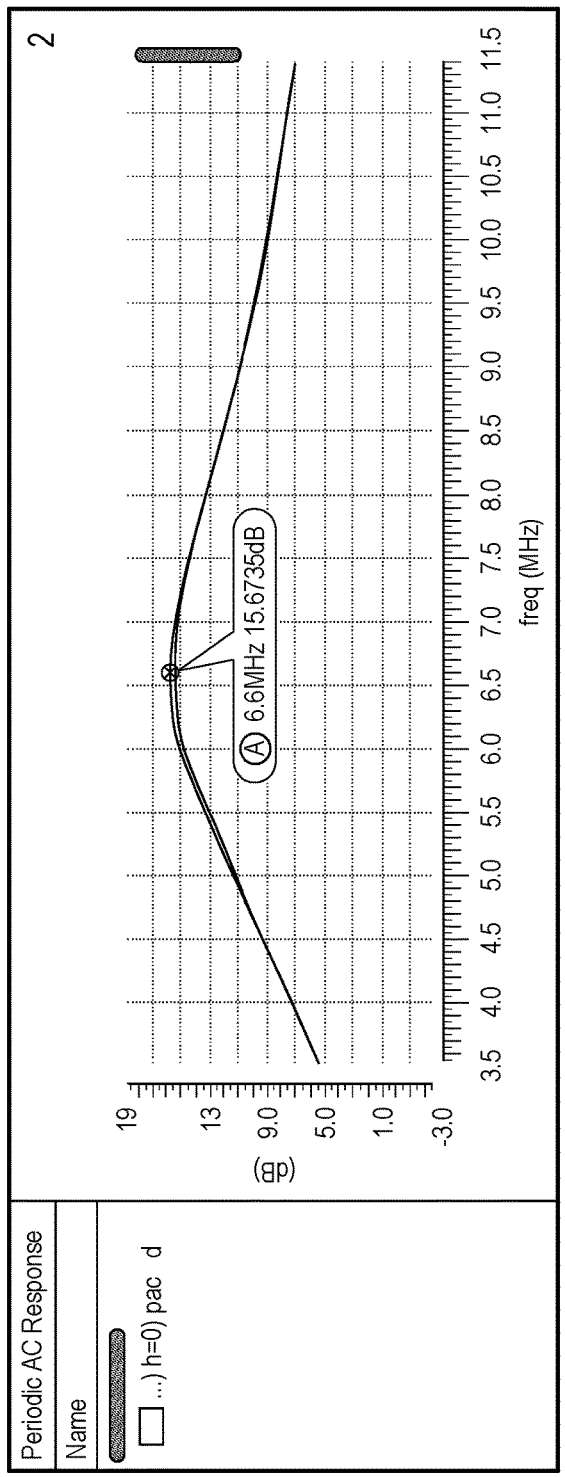

FIG. 8B: Simulation results of mixer 506 and baseband filter 510 together. This Fig is basically FIG. 8A minus the matching network voltage gain.

Figure 8C:
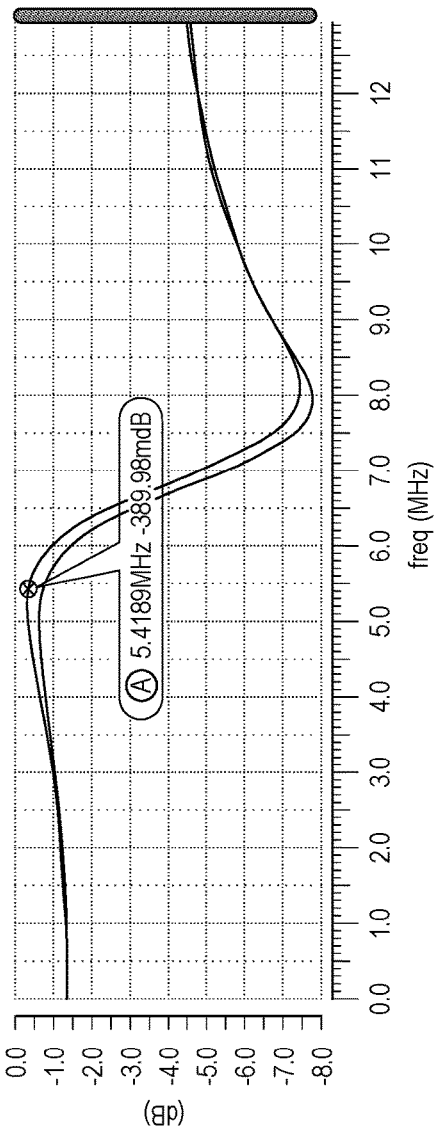

FIG. 8C: voltage gain of the mixer 506. The input to the mixer is an RF signal and the output is the baseband signal, so this Fig. shows the ratio of the signal amplitude at the baseband frequency output vs. the amplitude of the input signal at RF frequency.

Figure 8D:
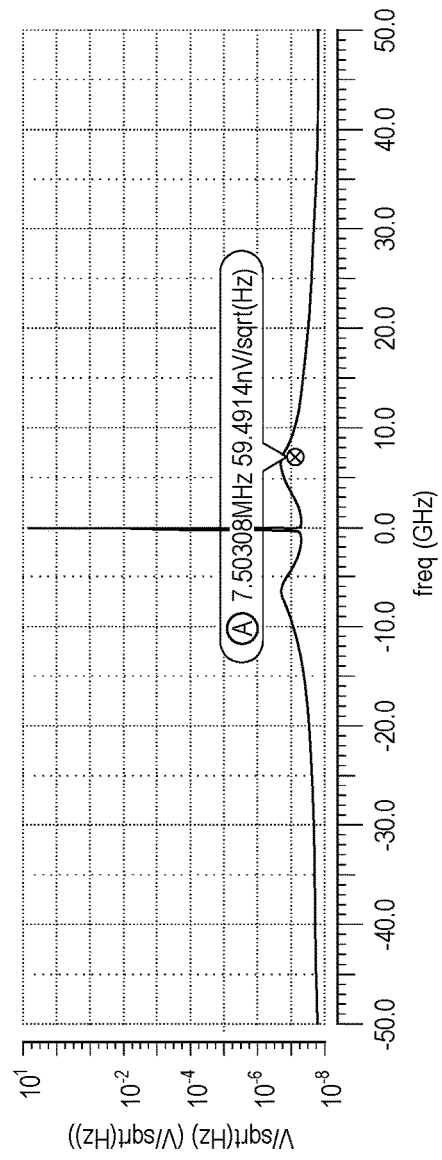

FIG. 8D: Scattering parameter (S-parameter) plot of the front-end looking at the input of the front-end (into the matching network). Typically a large negative number indicates that the input impedance is substantially close to the reference impedance (typically 50 ohms). In modern integrated receivers, it is acceptable to get closer to a large number but typically −10 dB is used as a compromise between input sensitivity (noise figure) and return loss.

Figure 8E:
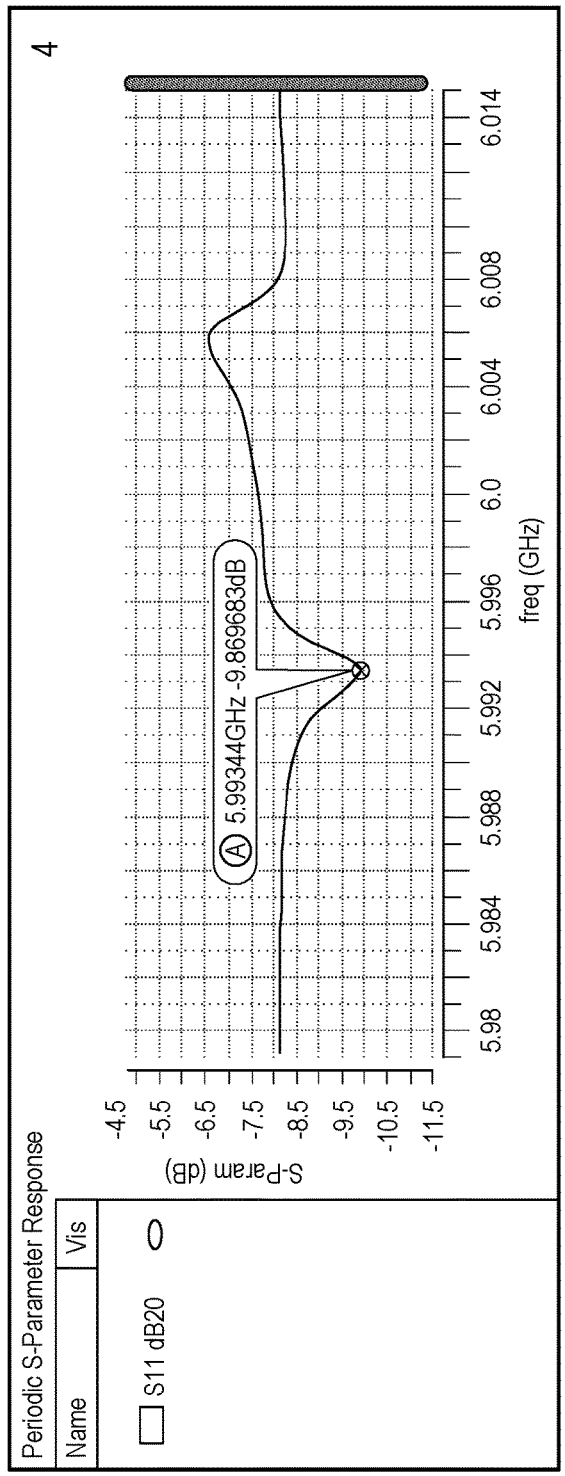

FIG. 8E: Shows output noise (noise at the output of the baseband filter, the final output of the receiver).

Figure 8F:
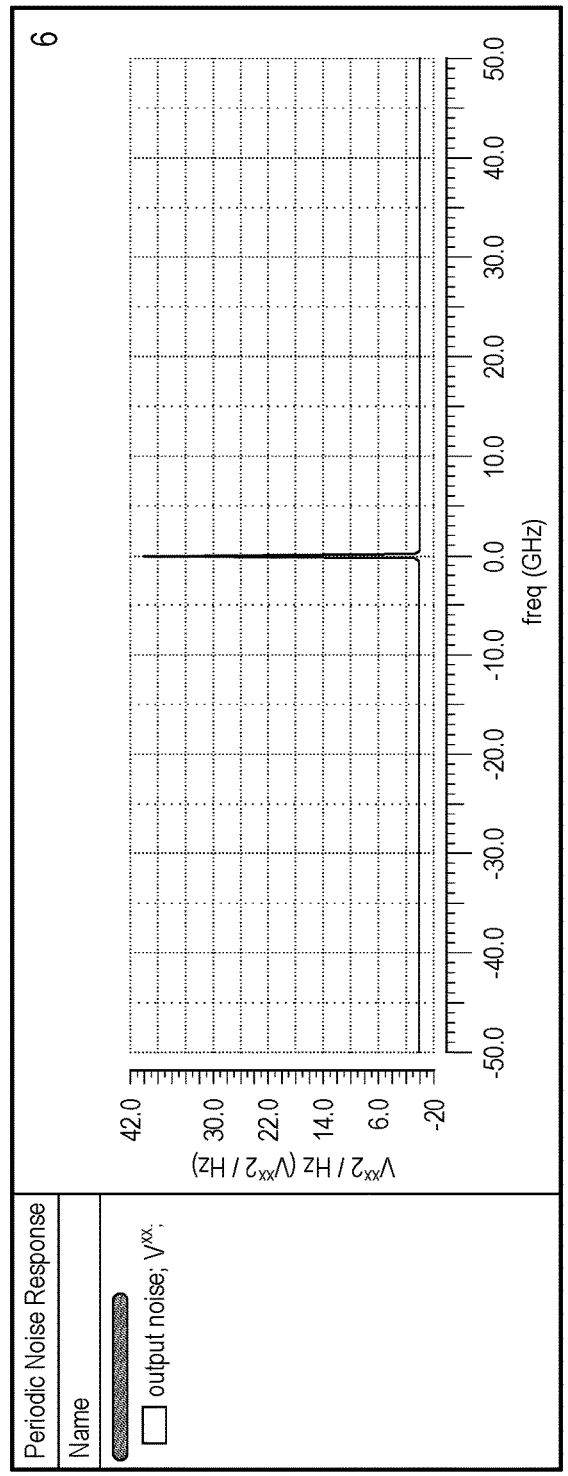

FIG. 8F: shows the input noise with the noise floor shown.

The description of the invention has been presented for purposes of illustration and description, and is not intended to be exhaustive or to limit the invention in the form disclosed. Many modifications and variations will be apparent to those of ordinary skill in the art without departing from the scope of the invention. The embodiments were chosen and described in order to explain the principles and applications of the invention, and to enable others of ordinary skill in the art to understand the invention. The invention may be implemented in various embodiments with various modifications as are suited to a particular contemplated use.

What is claimed is:

1. A circuit comprising:
a front end stage including
an impedance conversion network for receiving a signal and providing voltage or current gain, and
a wideband multiplier for receiving an output signal from the impedance conversion network and converting the output signal to differential output signals; and
a baseband stage including
a voltage mode mixer for receiving the differential output signals from the wideband multiplier and providing voltage gain, and
a baseband filter/amplifier for receiving a mixer output signal from the voltage mode mixer and filtering and amplifying the mixer output signal; and
wherein DC voltages of the front-end stage are biased independently of a biasing of DC voltages of the baseband stage.

2. The circuit according to claim 1, wherein the impedance conversion network includes one or more inductive elements to provide the voltage or current gain.

3. The circuit according to claim 1, wherein the baseband filter/amplifier includes one or more capacitors to block incoming DC voltage.

4. The circuit according to claim 3, wherein:
the mixer output signal propagates through the baseband filter/amplifier over a given path; and
said one or more capacitors are in series with the propagation of the mixer output signal to block the incoming DC voltage.

5. The circuit according to claim 1, wherein the baseband filter/amplifier is self-biased.

6. The circuit according to claim 5, wherein:
the voltage mode mixer includes one or more transistors, and each of the one or more transistors includes a gate; and
no DC current flows to the gates of the one or more transistors of the voltage mode mixer.

7. The circuit according to claim 6, wherein:
the DC voltage of the baseband stage include an input DC voltage of the baseband filter/amplifier and an output DC voltage; and
the input DC voltage and the output DC voltage of the baseband filter/amplifier are equal.

8. The circuit according to claim 7, wherein:
the baseband filter/amplifier includes an amplifier in series between the input and the output of the baseband filter/amplifier:
the amplifier includes an output; and
the output of the amplifier is used to bias the input of the baseband filter/amplifier.

9. The circuit according to claim 1, wherein:
the wideband multiplier includes one or more transistors for outputting the differential output signals; and
each of the one or more transistors include a source node; and
the source node of each of the one or more transistors is biased to zero voltage through the impedance network.

10. The circuit according to claim 9, wherein:
each of the one or more transistors includes a gate and has an on state and an off state; and
when each of the transistors is in the on state and a voltage $V_{DD}$ is applied to the gate of said each transistor, said each transistor has a gate source voltage $V_{GS}$ equal to $V_{DD}$.

11. A method comprising:
receiving a signal at a front end stage of a signal readout circuit, including
an impedance conversion network of the front end stage providing a voltage or current gain, and
a wideband multiplier of the front end stage receiving an output signal from the impedance conversion network and converting the output signal to differential output signals;
receiving the differential output signals at a baseband stage of the signal readout circuit, including
a voltage mode mixer of the baseband stage providing voltage gain, and
a baseband filter/amplifier of the baseband stage receiving a mixer output signal from the voltage mode mixer and amplifying the mixer output signal; and
biasing DC voltages of the front end stage and biasing DC voltages of the baseband stage, and wherein the biasing of the DC voltages of the front end stage is independent of the biasing of the DC voltages of the baseband stage.

12. The method according to claim 11, wherein the impedance conversion network includes one or more inductive elements to provide the voltage or current gain.

13. The method according to claim 11, wherein the baseband filter/amplifier includes one or more capacitors to block incoming DC voltage.

14. The method according to claim 11, wherein the baseband filter/amplifier is self-biased.

15. The method according to claim 14, wherein:
the voltage mode mixer includes one or more transistors, and each of the one or more transistors includes a gate; and
no DC current flows to the gates of the one or more transistors of the voltage mode mixer.

16. A circuit comprising:
a front end stage including
an impedance conversion network for receiving a RF signal from a computer memory and providing a voltage or current gain, and
a wideband multiplier for receiving an output signal from the impedance conversion network and converting the output signal to differential output signals; and
a baseband stage including
a voltage mode mixer for receiving the differential output signals from the wideband multiplier and providing voltage gain, the voltage mode mixer including one or more transistors, and each of the one or more transistors including a gate, and wherein no DC current flows to the gates of the one or more transistors of the voltage mode mixer, and
a baseband filter/amplifier for receiving a mixer output signal from the voltage mode mixer and filtering and amplifying the mixer output signal, the baseband filter/amplifier including an input DC voltage and an output DC voltage, and wherein the input DC voltage and the output DC voltage of the baseband filter/amplifier are equal; and
wherein DC voltages of the front-end stage are biased independently of a biasing of DC voltages of the baseband stage.

17. The circuit according to claim 16, wherein the baseband filter/amplifier includes one or more capacitors to block incoming DC voltage.

18. The circuit according to claim 16, wherein the baseband filter/amplifier is self-biased.

19. The circuit according to claim 16, wherein:
the wideband multiplier includes one or more transistors for outputting the differential output signals; and
each of the one or more transistors include a source node; and
the source node of each of the one or more transistors is biased to zero voltage through the impedance network.

20. The circuit according to claim 16, wherein:
the baseband filter/amplifier includes an amplifier in series between an input and an output of the baseband filter/amplifier:
the amplifier includes an output; and
the output of the amplifier is used to bias the input of the baseband filter/amplifier.

* * * * *